(12) United States Patent
Van Dalen et al.

(10) Patent No.: US 7,989,844 B2
(45) Date of Patent: Aug. 2, 2011

(54) SEMICONDUCTOR DEVICE AND METHOD OF MANUFACTURING SUCH A DEVICE

(75) Inventors: Rob Van Dalen, Eindhoven (NL); Prabhat Agarwal, Leuven (BE); Jan Willem Slotboom, Eindhoven (NL); Gerrit Elbert Johannes Koops, Leuven (BE)

(73) Assignee: NXP B.V., Eindhoven (NL)

( * ) Notice: Subject to any disclaimer, the term of this patent is extended or adjusted under 35 U.S.C. 154(b) by 864 days.

(21) Appl. No.: 10/545,736

(22) PCT Filed: Feb. 12, 2004

(86) PCT No.: PCT/IB2004/050103
§ 371 (c)(1),
(2), (4) Date: Aug. 16, 2005

(87) PCT Pub. No.: WO2004/075300
PCT Pub. Date: Sep. 2, 2004

(65) Prior Publication Data
US 2006/0202229 A1    Sep. 14, 2006

(30) Foreign Application Priority Data

Feb. 18, 2003    (EP) .................................... 03100368

(51) Int. Cl.
*H01L 29/732* (2006.01)
*H01L 29/737* (2006.01)

(52) U.S. Cl. ............. 257/197; 257/591; 257/E29.185; 257/E29.189

(58) Field of Classification Search .......... 257/197, 257/198, 591, E29.171, E29.173, E29.174, 257/E29.183, E29.185, E29.188, E29.189, 257/E29.193
See application file for complete search history.

(56) References Cited

U.S. PATENT DOCUMENTS 5,801,408 A * 9/1998 Takahashi ...................... 257/212
5,828,100 A * 10/1998 Tamba et al. ................ 257/328
(Continued)

FOREIGN PATENT DOCUMENTS
EP    1050908 A1 * 11/2000

OTHER PUBLICATIONS

Sze, S.M. Modern Semiconductor Device Physics. New York: Wiley Interscience, 1998. pp. 221-222.*

(Continued)

*Primary Examiner* — Samuel Gebremariam
*Assistant Examiner* — Andrew O. Arena

(57) ABSTRACT

The invention relates to a semiconductor device with a substrate (11) and a semiconductor body (12) with a heterojunction bipolar, in particular npn, transistor with an emitter region (1), a base region (2) and a collector region (3), which are provided with, respectively, a first, a second and a third connection conductor (4, 5, 6), and wherein the bandgap of the base region (2) is smaller than that of the collector region (3) or of the emitter region (1), for example by the use of a silicon-germanium mixed crystal instead of pure silicon in the base region (2). Such a device is characterized by a very high speed, but its transistor shows a relatively low BVeeo. In a device (10) according to the invention the doping flux of the emitter region (1) is locally reduced by a further semiconductor region (20) of the second conductivity type which is embedded in the emitter region (1). In this way, on the one hand, a low-impedance emitter contact is ensured, while locally the Gummel number is increased without the drawbacks normally associated with such an increase. In this way, the hole current in the, npn, transistor is increased and thus the gain is decreased. The relatively high gain of a Si—Ge transistor is responsible for the low BVCeOf which is consequently avoided in a device (10) according to the invention. Preferably the further semiconductor region (20) is recessed in the emitter region (1) and said emitter region (1) preferably comprises a lower doped part that borders on the base region (2) and that is situated below the further semiconductor region (20). The invention also comprises a method of manufacturing a semiconductor device (10) according to the invention.

10 Claims, 4 Drawing Sheets

U.S. PATENT DOCUMENTS

Figure 1:
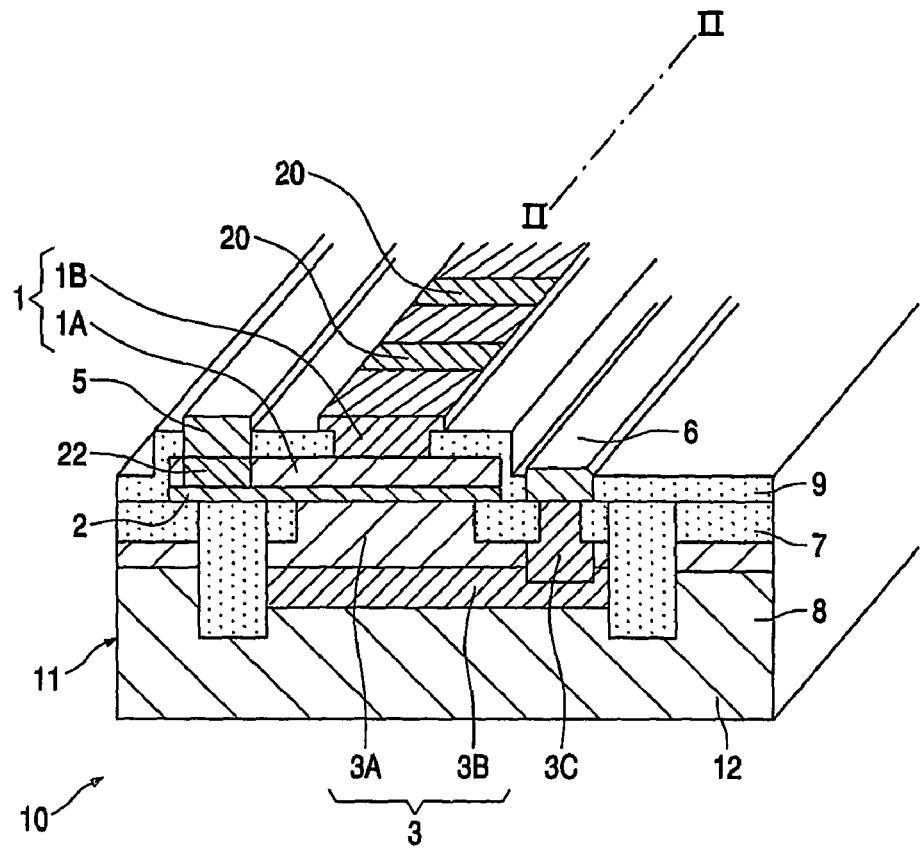

| | | | |
|---|---|---|---|
| 5,864,152 A | 1/1999 | Mori | |
| 6,225,649 B1* | 5/2001 | Minato | 257/133 |
| 6,346,453 B1* | 2/2002 | Kovacic et al. | 438/312 |
| 2002/0192918 A1 | 12/2002 | Kanzawa et al. | |
| 2004/0041171 A1* | 3/2004 | Ogura et al. | 257/197 |

OTHER PUBLICATIONS

Ng, Kwok K. Complete Guide to Semiconductor Devices. Wiley-Interscience, 2002. pp. 379-380.*

Schaper U et al: "Physical Scaling Rules for ALGAAS/GAAS Power HBT's Based on a Small-Signal Equivalent Circuit" IEEE Transactions on Microwave Theory and Techniques, IEEE Inc. New York, NY, US, vol. 46, No. 7, Jul. 1, 1998 pp. 1006-1009.

Shamir N et al: "Preventing Instability Damages in Multiple Finger Heterojunction Bipolar Transistors by Tunnel Diode Emitter Design" IEEE Transactions on Electron Devices, IEEE Inc., New York, NY, US, vol. 50, No. 3, Mar. 2003, pp. 859-861.

* cited by examiner

SEMICONDUCTOR DEVICE AND METHOD OF MANUFACTURING SUCH A DEVICE

The invention relates to a semiconductor device with a substrate and a semiconductor body of silicon comprising a bipolar heterojunction transistor with an emitter region of a first conductivity type, a base region of a second conductivity type, which is opposite to the first conductivity type, and a collector region of the first conductivity type, which are provided with, respectively, a first, a second and a third connection conductor, wherein the base region comprises a semiconductor material whose bandgap is smaller than that of the material of the collector region or of the emitter region.

The invention also relates to a method of manufacturing such a device.

Such a device and such a method are known from U.S. patent specification U.S. Pat. No. 5,198,689, published on 30 Mar. 1993. Said document describes a semiconductor device with a bipolar transistor having a heterojunction near the junction between the base region and the collector region and near the junction between the base region and the emitter region, which is obtained by forming the base region from a mixed crystal of silicon and germanium. Such a transistor has very favorable high-frequency properties, as evidenced, inter alia, by a high cut-off frequency $f_T$.

A drawback of the known transistor, which manifests itself particularly if the base region has a relatively high germanium content, is that it has a comparatively low breakdown voltage from the emitter to the collector, the so-termed $BV_{ceo}$, which is undesirable.

Therefore it is an object of the invention to provide a semiconductor device with a bipolar transistor which does not have said problem and which, despite the presence of germanium in the base region, has an acceptable emitter-collector breakdown voltage.

To achieve this, in accordance with the invention, a semiconductor device of the type mentioned in the opening paragraph is characterized in that the doping dose of the emitter region is locally reduced by a further semiconductor region of the second conductivity type which is embedded in the emitter region.

In this case, "doping dose" is to be taken to mean the overall quantity of doping atoms per unit of area, i.e. the integral of the doping concentration across the thickness of the emitter region. At a constant doping concentration, the doping dose is equal to the product (N×d) of the doping concentration (N) and the thickness (d) of the emitter region. The invention is based on the recognition that the reduction of the $BV_{ceo}$ in the known device is caused by the comparatively low base current of the transistor, which entails a comparatively high current gain of such a transistor. After all, the collector current of such a transistor is comparatively high, which is desirable for a very fast transistor with a high $f_T$. The invention is further based on the recognition that, in a device in accordance with the invention, the gain has been reduced. After all, in the case of a state-of-the-art bipolar transistor with a monocrystalline emitter the base current, for an npn transistor, is determined mainly by the recombination of holes at the silicon-conductor interface of the emitter. As this recombination speed at such a silicon-metal interface is very high, the base current is actually determined by the Gummel number which, in a first order, is proportional to the doping concentration and the thickness of the emitter or, if the doping concentration is not constant, proportional to the doping dose of the emitter region, through which the holes must cross. To increase the hole current it is thus required that either the thickness of the emitter region or the doping concentration, or both, are chosen to be comparatively small. The first option is not attractive because of the risk of so-termed spikes if the emitter is thin, the second option is not attractive either because a low-impedance contact requires the doping concentration near the connection conductor to be high. By providing a further semiconductor region of the second conductivity type, i.e. the p-type in the case of an npn transistor, in such a manner that it is embedded in the emitter region, a reduction of the doping dose is achieved without the above-mentioned drawbacks associated with a small thickness of the emitter region or a low doping concentration of said region. Finally, an important advantage of a device in accordance with the invention resides in that its high-frequency behavior still proves to be excellent.

In a preferred embodiment of a semiconductor device in accordance with the invention, the further semiconductor region is recessed in the emitter region on a side of the emitter region that borders on the first connection conductor. Excellent results have thus been obtained and, in addition, the device of this modification can be manufactured comparatively easily, for example, by means of an ion implantation to form the further semiconductor region.

Preferably, the emitter region comprises a first part having a high doping concentration that borders on the first connection conductor, and a second part having a lower doping concentration that borders on the base region and extends below the further semiconductor region. As a result, on the one hand, a low-impedance contact of the emitter region is ensured and, on the other hand, the base current is further reduced as the lightly doped part of the emitter region also contributes to the reduction of the Gummel number at the location of the further semiconductor region.

Good results are obtained if the further semiconductor region comprises a number of sub-regions which are mutually separated by parts of the emitter region. The behavior of the transistor is thus determined in a manner that is as homogeneous as possible. The dimensions of the sub-regions of the further semiconductor regions preferably range between 0.1 µm and 2 µm, and the parts of the emitter region situated therebetween preferably have dimensions in the range of 0.1 µm to 20 µm.

Preferably, the sub-regions of the further semiconductor region are juxtaposed in the longitudinal direction of the emitter region. This too makes the manufacture of a device in accordance with the invention comparatively simple. The emitter region is preferably situated at the surface of the semiconductor body so that, for the formation of the further semiconductor region, use can be made of an accurate, reproducible and simple technique such as ion implantation. The best results are obtained if the first conductivity type is the n-type. Implantation of the further semiconductor region can be carried out, for example, by means of boron ions.

In a favorable embodiment of a device in accordance with the invention, the germanium contact of the base region ranges between 10 and 30 at. %, and is preferably approximately 20 at. %.

A method of manufacturing a semiconductor device with a substrate and a semiconductor body of silicon comprising a bipolar transistor with an emitter region of a first conductivity type, a base region of a second conductivity type, which is opposite to the first conductivity type, and a collector region of the first conductivity type, which are provided with, respectively, a first, a second and a third connection conductor, wherein the base region is provided with a semiconductor material the bandgap of which is smaller than that of the material of the collector region or of the emitter region, is characterized in accordance with the invention in that the doping dose of the emitter region is locally reduced by a further semiconductor region of the second conductivity type which is embedded in the emitter region.

Preferably, the further semiconductor region is formed so as to be recessed in the emitter region from the surface of the semiconductor body. In a favorable modification, the emitter region is formed so as to comprise a first part having a high doping concentration which borders on the first connection conductor, and a second part having a lower doping concentration which borders on the base region, the second part being formed below the further semiconductor region.

These and other aspects of the invention are apparent from and will be elucidated with reference to the embodiment(s) described hereinafter.

Figure 2:
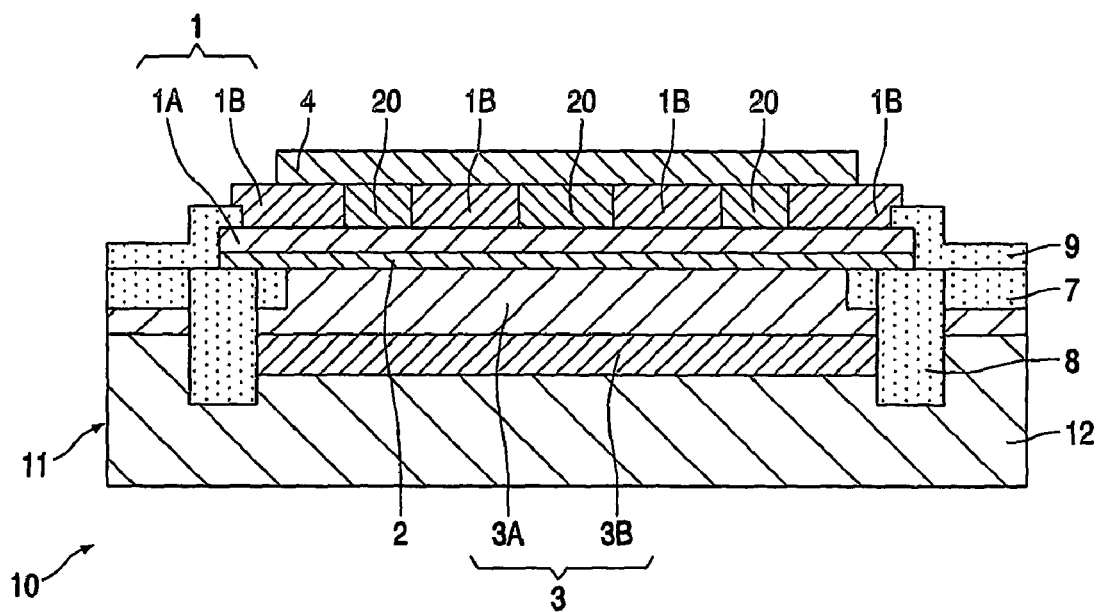
Figure 3:
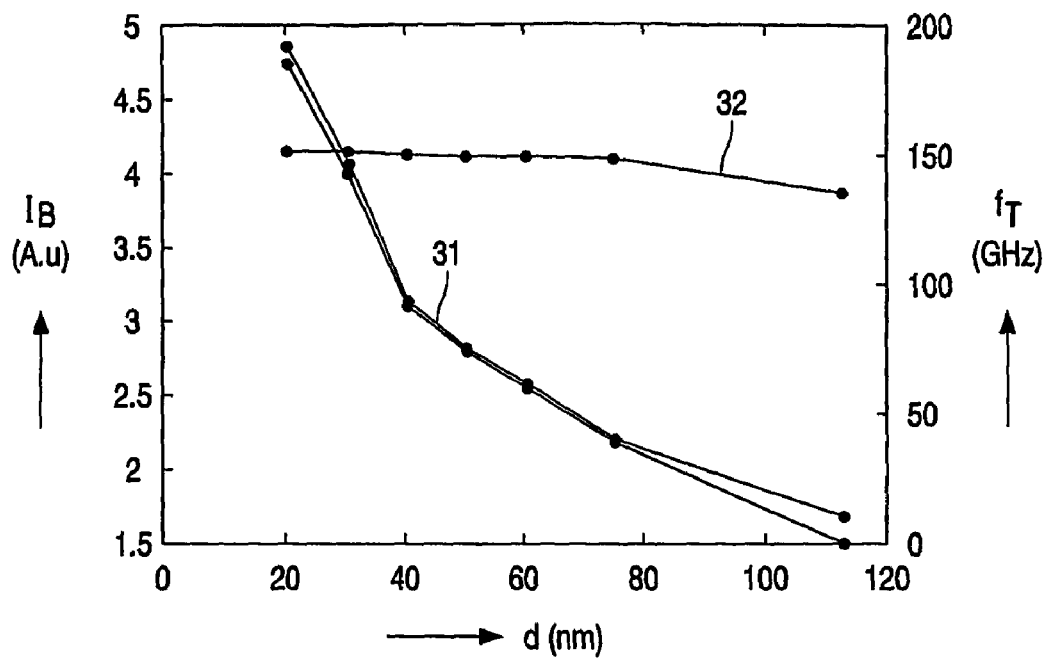
Figure 4:
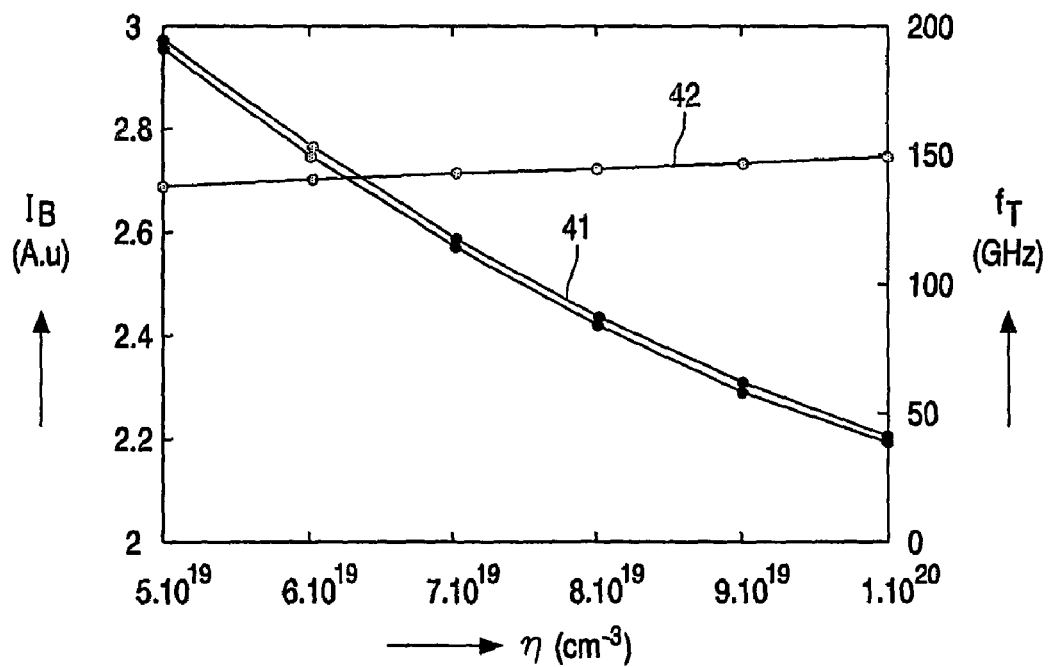
Figure 5:
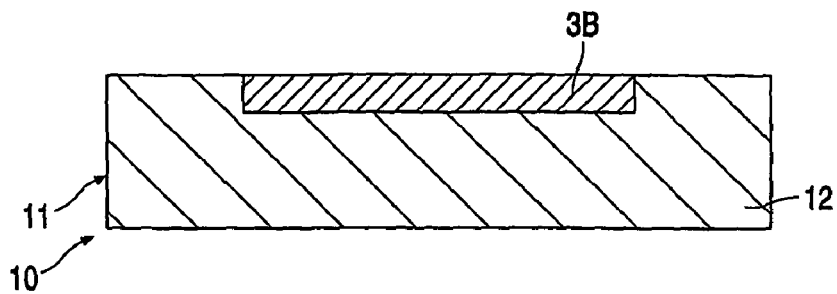
Figure 6:
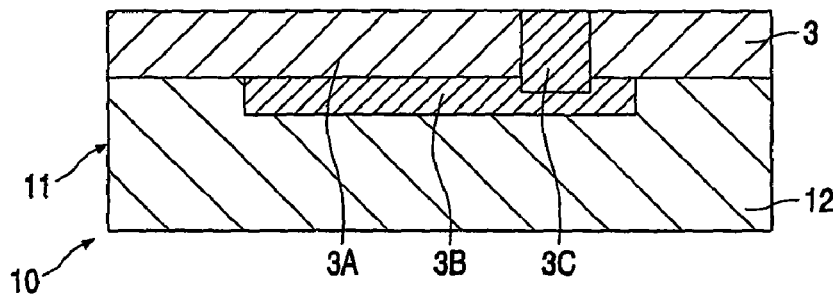
Figure 7:
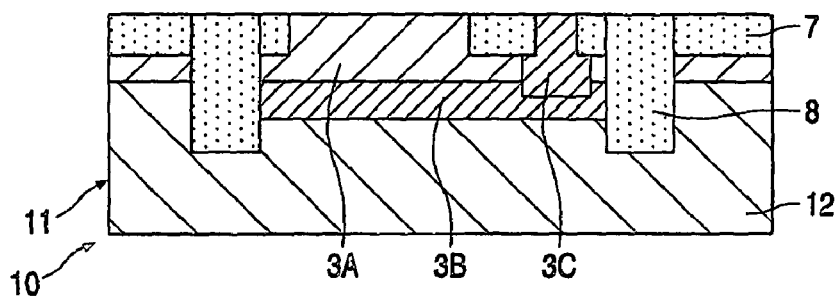
Figure 8:
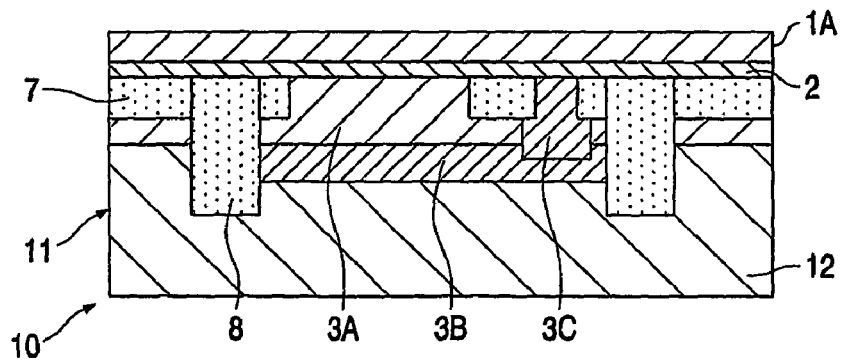
Figure 9:
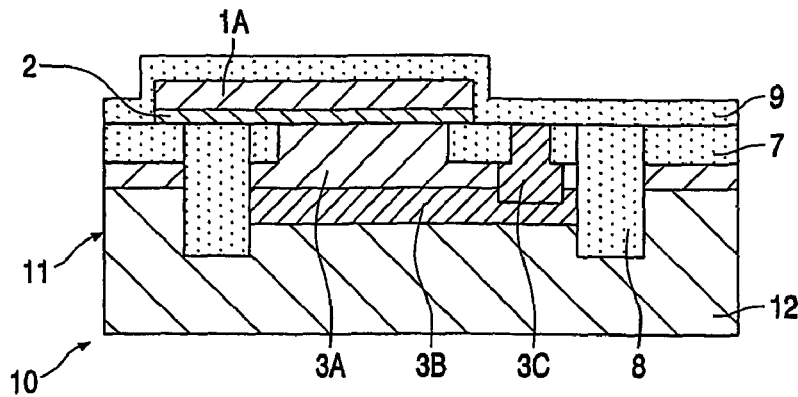
Figure 10:
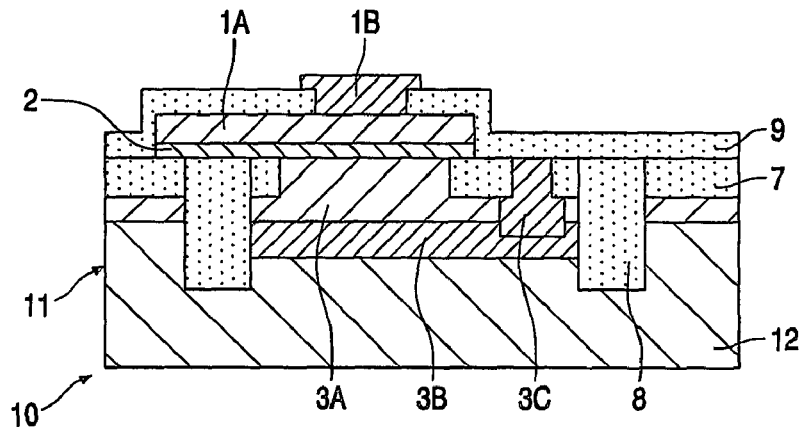
Figure 11:
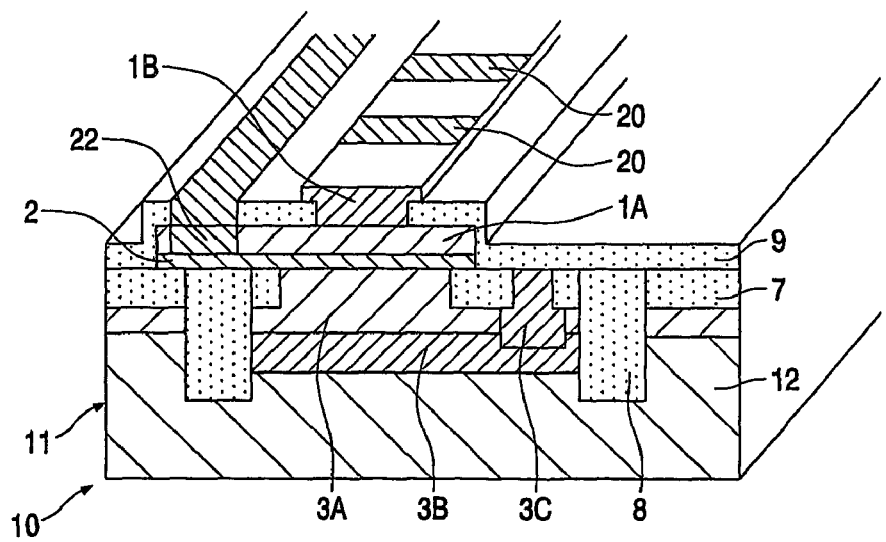

In the drawings:

FIG. 1 is a diagrammatic, perspecpective view of an embodiment of a semiconductor device in accordance with the invention, FIG. 2 is a diagrammatic, cross-sectional view at right angles to the thickness direction and taken on the line II-II of the device shown in FIG. 1, FIG. 3 shows the rated base current ($I_B$) and the maximum cut-off frequency $f_T$ as a function of the thickness (d) of the part of the emitter region of the device shown in FIG. 1 that is situated below the further semiconductor region, and FIG. 4 shows the rated base current ($I_B$) and the maximum cut-off frequency $f_T$ as a function of the doping concentration (n) of the part of the emitter region of the device shown in FIG. 1 that is situated below the further semiconductor region, and FIGS. 5 through 11 are diagrammatic, cross-sectional views at right angles to the thickness direction, or in perspective as in FIG. 11, of the device of FIG. 1 in successive stages of the manufacture by means of a method in accordance with the invention.

The Figures are not drawn to scale and some dimensions are exaggerated for clarity. Corresponding regions or parts are indicated by means of the same reference numerals whenever possible.

FIG. 1 is a diagrammatic, cross-sectional view at right angles to the thickness direction, of an embodiment of a semiconductor device in accordance with the invention. FIG. 2 is a diagrammatic, cross-sectional view at right angles to the thickness direction and taken along the line II-II of the device shown in FIG. 1. The device 10 of this example comprises (see FIG. 1) a semiconductor body 11 with a p-type silicon substrate 12 and a semiconductor layer structure provided thereon and with a bipolar transistor. The, in this example discrete, transistor has an n-type emitter region 1, a p-type base region 2 and an n-type collector region 3, which are provided with, respectively, a first, a second and a third connection conductor 4, 5, 6. The connection conductor 4 of the emitter region 1 is shown in FIG. 2, but omitted in FIG. 1 for clarity. The base region 2 comprises a mixed crystal of silicon and germanium having a germanium content of 20 at. %. The collector 3 and the emitter 1 contain silicon. The collector 3 comprises, in this case, a lightly doped part 3A, the so-termed drift region, and a heavily doped part 3B that borders on the substrate 12. The connection conductors 4, 5, 6 of, respectively, the emitter region 1, the base region 2 and the collector region 3 contain, in this case, aluminum. The emitter region 1 comprises, in this case, a first part (1B) that has a high doping concentration and borders on the connection conductor 4, and a second part (1A) that has a lower doping concentration and borders on the base 2. The connection conductor 6 is connected to the collector region 3 by means of a heavily doped collector connection region 3C that is recessed in the semiconductor body 11. The device 10 further comprises different isolating regions 7, 8, 9 which, in this case, contain silicon dioxide.

In accordance with the invention, the doping dose of the emitter region 1 is locally reduced by a further semiconductor region 20 of the second, in this case p-, conductivity type which is embedded in the emitter region 1. The p-type region 20 is, in this case, recessed at the location of the regions 20 in the most heavily doped part 1B of the emitter region 1 and reaches as far as the less heavily doped part 1A of the emitter region 1. As a result, the emitter region 1 locally comprises parts 1A having a reduced thickness which are situated below the recessed further region 20. As a result, the doping dose which, at a constant doping concentration, is the product of the thickness and the doping concentration is locally reduced in the emitter region 1. This results in a higher base current during operation of the device, as a result of which the gain of the transistor is reduced. This is an important advantage because the presence of a mixed crystal of silicon and germanium in the base region 2, on the contrary, leads to a relatively low base current and hence to an increase of the gain of the transistor, which would in turn lead to a relatively low $BV_{ceo}$, which is undesirable. The increase of the base current as a result of the measure in accordance with the invention will, entirely or partly, compensate for said reduction, as a result of which the undesirable reduction of $BV_{ceo}$ in a device 10 in accordance with the invention does not take place. The p-type further region 20 is formed, in this case, by a local ion implantation.

The lateral dimensions of the device 10 of this example are 4 μm×10 μm. The part 1A of the emitter region 1 has a doping concentration of $2 \times 10^{18}$ at/cm$^3$ and a thickness of approximately 100 nm, the part 1B has a doping concentration of approximately $10^{20}$ at/cm$^3$ and a thickness of approximately 0.2 μm. The base region has a doping concentration of approximately $10^{19}$ at/cm$^3$ and a thickness of 30 nm. The parts 3A, 3B of the collector region 3 have a doping concentration of, for example, $5 \times 10^{17}$ at/cm$^3$ and $10^{20}$ at/cm$^3$, respectively, and a thickness of 50 nm and 500 nm, respectively. The width of the emitter region 1 is 500 nm, in this case, while the length is 5 μm. The dimensions of the p-type regions 20 are 500 nm×200 nm and the spacing between them is 200 nm. The thickness of the further regions 20 is, in this case, approximately 0.2 μm, so that the underlying part 1A of the emitter region 1 has a thickness of 100 nm at said location, being the difference between the original thickness of the emitter region 1 (0.2 μm+0.1 μm) and the thickness of the further region 20 (0.2 μm). The effect of the local reduction of the doping dose of the emitter region 1, i.e. the influence thereof on the base current $I_B$, will be illustrated hereinafter by means of FIGS. 3 and 4.

FIG. 3 shows the rated base current ($I_B$) and the maximum cut-off frequency $f_T$ as a function of the thickness (d) of the part of the emitter region of the device of FIG. 1 that is situated below the further semiconductor region. FIG. 4 shows the rated base current ($I_B$) and the maximum cut-off frequency $F_T$ as a function of the doping concentration (n) of the part of the emitter region of the device of FIG. 1 that is situated below the further semiconductor region. Curves 31 of FIG. 3 and curves 41 of FIG. 4 show that by a local reduction of, respectively, the thickness d of the emitter region 1 by means of the further region 20 and of the doping concentration n of the emitter region 1, the base current $I_B$ can be easily reduced by, respectively, a factor of 3 and a factor of 1.5. By reducing the doping dose by locally reducing the thickness d as well as the doping concentration n, a base current increase by a factor of 4.5 (=3×1.5) can thus be readily achieved, as a result of which the gain is reduced by an equal factor of 4.5. A local reduction of the doping concentration can be achieved, for example, by building up the emitter region 1 out of two parts, i.e. a first part having a comparatively low doping concentration that borders on the base region 2, and a second part having a comparatively high doping concentration that borders on the connection conductor 4.

Curves 32 and 42 in FIG. 3 and FIG. 4, respectively, show that this hardly involves an unfavorable influence on the speed of the device 10 in accordance with the invention. Said curves 32, 42 show the variation of the maximum cut-off frequency $F_T$ as a function of the above-mentioned thickness d and doping concentration n. This means that said frequency, which ranges between 140 and 150 GHz, changes hardly if the doping dose is locally reduced in the emitter region 1 in a device 10 in accordance with the invention. The device 10 of this example is manufactured, for example, in the following manner by means of a method in accordance with the invention.

FIGS. 5 through 11 are diagrammatic, cross-sectional views at right angles to the thickness direction, or in perspective as in FIG. 11, of the device of FIG. 1 in successive stages of the manufacture by means of a method in accordance with the invention. For the starting material (see FIG. 5) use is made of a p-type silicon substrate 11 in which, by means of local ion implantation (the mask used is not shown), a heavily doped part 3B is formed of the collector region 3 of the transistor to be formed of the device 10 with the semiconductor body 11.

Subsequently (see FIG. 6) by means of epitaxy an n-type layer 3 is provided that forms a drift region 3A of the collector region 3 to be formed. A connection region 3C of the collector region 3 is locally formed therein (the mask used is not shown) by means of ion implantation.

Subsequently (see FIG. 7) isolating regions 7, 8 of silicon dioxide are formed in the semiconductor body 11 by means of etching and (local) oxidation of the semiconductor body 11 of silicon. The masks used in said process are not shown in the drawing. First of all the surface is covered with a silicon dioxide region 7 by means of local oxidation. Next, grooves are etched which are turned into an isolating region 8, a so-termed STI (=Shallow Trench Isolation) region 8, by filling the grooves using TEOS (=Tetra Ethyl Ortho Silicate). The parts of the oxide layer deposited in this process that are situated outside (and above) the grooves are removed again by means of CMP (=Chemical Mechanical Polishing).

Subsequently (see FIG. 8) by means of epitaxy a p-type silicon layer 2 is applied to which 20 at. % germanium is added, which layer will form the base region 2, and an n-type silicon layer 1A is provided thereon which will form a less heavily doped part of the emitter region 1. The parts of these layers 2, 1A situated above the isolation regions 7, 8 are polycrystalline, the parts situated therebetween are monocrystalline.

Next (see FIG. 9) parts of the layers 2, 1A that are situated outside the active region 3A are removed by means of photolithography and etching. The mask used for this purpose, which is made of for example silicon dioxide, is not shown in the drawing and is subsequently removed again. Next the entire surface of the semiconductor body 11 is covered with an isolating layer 9 of silicon dioxide which is provided by means of CVD (=Chemical Vapor Deposition).

Subsequently (see FIG. 10) an opening is formed in the isolating layer 9 by means of photolithography and etching. Next, by means of CVD, an n-type silicon layer 1B is applied to the surface of the semiconductor body 11 and patterned by means of photolithography and etching. The resultant monocrystalline, n-type region 1B forms a more heavily doped part 1B of the emitter region 1.

Next (see FIG. 11) the entire surface of the semiconductor body 11 is covered with a mask layer, for example of a photoresist, which mask layer is not shown. Openings are formed therein at the location of the regions 20 to be formed in the silicon region 1B, after which the p-type regions 20 are formed by means of a boron ion implantation. A series of p-type regions 20 is thus formed in the more heavily doped part 1B of the emitter region 1, as shown in FIG. 2. At the location of these regions 20, the emitter region 1 thus has a smaller thickness and, in addition, a relatively low doping concentration. Said boron ion implantation is also used, in this case, to form connection regions 22 for the base region 2. For this purpose, a suitable opening is formed in the isolating layer 9 and, in addition, in the above-mentioned mask that is not shown in the drawing.

Next (see FIGS. 1 and 2) a contact opening is formed in the isolating layer 9 at the location of the collector connection region 3C, after which an aluminum layer is deposited from which the connection conductors 4, 5, 6 of, respectively, the emitter region 1, the base region 2 and the collector region 3 are formed by means of photolithography and etching. Individual devices 10 which are ready for final assembly are subsequently obtained after a separation process such as sawing.

The invention is not limited to the examples given herein, and within the scope of the invention many variations and modifications are possible to those skilled in the art. For example, besides in a discrete semiconductor device, the invention is also excellently suited for use in an integrated semiconductor device such as a BICMOS (=Bipolar Complementary Metal Oxide Semiconductor) IC (=Integrated Circuit).

It is further noted that instead of STI isolation regions, isolation regions obtained by means of the LOCOS (=Local Oxidation Of Silicon) technique can be applied. The structure of a device in accordance with the invention may be formed so as to comprise one or more mesa-shaped parts but also so as to be (substantially) entirely planar. Another modification is obtained by realizing the desired variation of the bandgap in the emitter, base and collector by increasing the bandgap of the base region with respect to the collector region (or the emitter region) instead of by reducing the bandgap of said region(s). The collector region (and the emitter region) may then contain, for example, silicon carbide while the base region contains silicon.

As regards a method in accordance with the invention it also applies that many variations and modifications are possible. For example, the heavily doped part of the emitter region may also be formed by means of outdiffusion from a so-termed PSG (=Phosphor Silicate Glass) layer or from a polycrystalline layer that forms part of the connection conductor of the emitter region. The base region may alternatively be formed by means of a BSG (=Boron Silicate Glass) layer or by means of VPD (=Vapor Phase Doping). For the connection of the base region it is also possible to use a doped polycrystalline Si.

The invention claimed is:
1. A semiconductor device with a substrate and a semiconductor body of silicon comprising:
    a bipolar heterojunction transistor configured with
        emitter, base and collector regions electrically and physically connected to respective first, second and third connection conductors for bipolar heterojunction operation the emitter region being of a first conductivity type, a further semiconductor region of a second conductivity type and embedded in the emitter region, and configured with an underlying portion of the emitter region to locally reduce the doping dose of the emitter region, relative to the doping dose of the underlying portion of the emitter region, the collector region being of the first conductivity type, and the base region being of a second conductivity type, which is opposite to the first conductivity type, and including a semiconductor material whose bandgap is smaller than that of the material of the collector region or of the emitter region.

2. A semiconductor device as claimed in claim 1, characterized in that the emitter region includes a lower heavily-doped region that forms a first layer and a second layer on the first layer, the second layer including upper heavily-doped regions that alternate with regions of the further semiconductor region, the upper heavily-doped region and the further semiconductor layer having a common thickness, and the further semiconductor region is recessed in the emitter region on a side of the emitter region that borders on the first connection conductor and is configured and arranged to set the gain of the bipolar heterojunction transistor to a reduced level, relative to the gain of such a transistor in which the further semiconductor region is of the same composition as the lower heavily-doped region.

3. A semiconductor device as claimed in claim 1, characterized in that the emitter region comprises a first part having a high doping concentration that borders on the first connection conductor, and a second part having a lower doping concentration that borders on the base region and extends below the further semiconductor region.

4. A semiconductor device as claimed in claim 1, characterized in that the further semiconductor region comprises a number of sub-regions which are mutually separated by parts of the emitter region.

5. A semiconductor device as claimed in claim 4, characterized in that the dimensions of the sub-regions of the further semiconductor region lie in the range of 0.1 µm to 2 µm, and the parts of the emitter region situated therebetween have dimensions in the range of 0.1 µm to 10 µm.

6. A semiconductor device as claimed in claim 4, characterized in that the sub-regions of the further semiconductor region are juxtaposed in the longitudinal direction of the emitter region.

7. A semiconductor device as claimed in claim 1, characterized in that the emitter region is situated at the surface of the semiconductor body.

8. A semiconductor device as claimed in claim 1, characterized in that the base region includes between about 10% and 30% germanium.

9. A semiconductor device as claimed in claim 1, characterized in that the first conductivity type is the n-conductivity type.

10. A semiconductor device with a substrate and a semiconductor body of silicon comprising:

a bipolar heterojunction transistor configured with emitter, base and collector regions electrically and physically connected to respective first, second and third connection conductors for bipolar heterojunction operation, wherein the base region includes germanium, and the emitter region being of a first conductivity type, a further semiconductor region of a second conductivity type and embedded in the emitter region, and configured with an underlying portion of the emitter region to locally reduce the doping dose of the emitter region, relative to the doping dose of the underlying portion of the emitter region, and configured and arranged to facilitate a low-impedance contact to the emitter region and a reduced base current, relative to such an emitter region without the further semiconductor region, the collector region being of the first conductivity type, and the base region being of a second conductivity type, which is opposite to the first conductivity type, and including a semiconductor material whose bandgap is smaller than that of the material of the collector region or of the emitter region.

\* \* \* \* \*